US009323114B2

(12) United States Patent
Xuan

(10) Patent No.: US 9,323,114 B2
(45) Date of Patent: Apr. 26, 2016

(54) SELF-LUMINOUS REFLECTIVE PIXEL STRUCTURE, DISPLAY PANEL, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventor: Kun Xuan, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 43 days.

(21) Appl. No.: 14/240,473

(22) PCT Filed: May 7, 2013

(86) PCT No.: PCT/CN2013/075263
§ 371 (c)(1),
(2) Date: Feb. 24, 2014

(87) PCT Pub. No.: WO2014/153808
PCT Pub. Date: Oct. 2, 2014

(65) Prior Publication Data
US 2014/0327868 A1 Nov. 6, 2014

(30) Foreign Application Priority Data
Mar. 29, 2013 (CN) .......................... 2013 1 0109413

(51) Int. Cl.
*G02F 1/1343* (2006.01)
*G02F 1/1335* (2006.01)
*H01L 27/32* (2006.01)

(52) U.S. Cl.
CPC ...... *G02F 1/134309* (2013.01); *H01L 27/3232* (2013.01)

(58) Field of Classification Search
CPC ............ H01L 27/3232; H01L 27/3225; G02F 2201/44; G02F 1/134336; G02F 1/133707; G02F 1/1393; G02F 1/134309; G02F 1/134363; G02F 1/136213; G02F 1/133553; G02F 1/133555; G02F 1/136227; G02B 26/001
USPC .......................................... 349/143, 141, 113
See application file for complete search history.

(56) References Cited

U.S. PATENT DOCUMENTS

RE41,673 E * 9/2010 Ma et al. ....................... 313/504
2003/0201960 A1* 10/2003 Fujieda ............. G02F 1/133603 345/87

(Continued)

FOREIGN PATENT DOCUMENTS

CN 1665361 A 9/2005
CN 1714380 A 12/2005

(Continued)

OTHER PUBLICATIONS

International Search Report mailed Sep. 1, 2014; PCT/CN2013/075263.

(Continued)

*Primary Examiner* — Mike Qi
(74) *Attorney, Agent, or Firm* — Ladas & Parry LLP

(57) ABSTRACT

A self-luminous reflective pixel structure, a display panel and a display device. The pixel structure includes a first electrode capable of reflecting light, a self-luminous layer disposed over the first electrode, a second electrode disposed over the self-luminous layer, and a reflected light control layer disposed over the second electrode. A self-luminous structure and a reflective structure can be formed in a single pixel with the pixel structure.

12 Claims, 2 Drawing Sheets

6
7
10
3
2
1

(56) References Cited

U.S. PATENT DOCUMENTS

2005/0194896 A1 9/2005 Sugita et al.
2006/0072047 A1 4/2006 Sekiguchi
2010/0302614 A1* 12/2010 Peng et al. .................... 359/230
2012/0069064 A1* 3/2012 Yamakita ................ G02F 1/167 345/690
2012/0099047 A1* 4/2012 Lee ..................... H01L 27/3232 349/62

FOREIGN PATENT DOCUMENTS

CN 1937239 A 3/2007
CN 101025482 A 8/2007
CN 203250091 U 10/2013
JP 11-249135 A 9/1999
WO 2004077137 A1 9/2004

OTHER PUBLICATIONS

First Chinese Office Action Appln. No. 201310109413.9; Dated Jan. 12, 2015.

First Chinese Office Action dated Jan. 12, 2015; Appln. No. 201310109413.9.

International Preliminary Report on Patentability Appln. No. PCT/CN2013/075263; Dated Sep. 29, 2015.

* cited by examiner

SELF-LUMINOUS REFLECTIVE PIXEL STRUCTURE, DISPLAY PANEL, AND DISPLAY DEVICE

TECHNICAL FIELD

Embodiments of the present invention relate to a self-luminous reflective pixel structure, a display panel and a display device.

BACKGROUND

A transflective display devices is a developing trend of the display technology as it takes advantage of a transmissive display device and a reflective display device.

In the existing transflective display device, typically, a transmissive display structure is disposed in one portion of a display region of a pixel unit, while a reflective display structure is disposed in another portion of the display region of the pixel unit. However, such a configuration decreases the actual display area of the display region and degrades the display effect of the display device.

SUMMARY

Embodiments of the present application provide a self-luminous reflective pixel structure, a display panel and a display device, which can maintain the area of the display region and improve the display effect of a display device.

Embodiments of the present application provide a self-luminous reflective pixel structure comprising: a first electrode capable of reflecting lights, and preferably, the first electrode serving as the anode of a self-luminous layer; a self-luminous layer disposed over the first electrode; a second electrode disposed over the self-luminous layer, and preferably, the second electrode serving as the cathode of the self-luminous layer; and a reflected light control layer disposed over the second electrode.

For example, the self-luminous layer and the second electrode are made of transparent materials.

For example, the reflected light control layer comprises: a reflected light modulation liquid crystal layer disposed over the second electrode; a liquid crystal control electrode layer disposed over the reflected light modulation liquid crystal layer. A voltage difference between the liquid crystal control electrode layer and the second electrode is capable of deflecting the liquid crystal in the reflected light modulation liquid crystal layer.

For example, the reflected light control layer comprises: a reflection clearance control electrode layer disposed over the second electrode and forming a spatial clearance with the second electrode. An electrostatic force generated between the reflection clearance control electrode layer and the first electrode is capable of controlling the first electrode to move so as to change the size of the spatial clearance between the reflection clearance control electrode layer and the second electrode.

For example, the reflected light control layer further comprises supports, located at both sides of the spatial clearance.

For example, depending on the different materials of the self-luminous layer and the manner for luminescence control, the first electrode can also serve as the cathode of the self-luminous layer and the second electrode can serve as the anode of the self-luminous layer.

Embodiments of the present application further provide a display panel which comprises a self-luminous reflective pixel structure according to the embodiments of the present application.

Embodiments of the present application further provide a display device which comprises the display panel according to the embodiments of the present application.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise stated, technical terms or scientific terms used herein should be construed as general meanings that those skilled in the art understand. The terms "first", "second" and the like used in the description and the claims in the present patent application are used not to limit to any sequence, quantity or importance, and they are only used to distinguish different components. The terms "a", "an", "this", "the" and the like used before an element are not limitative to the quantity thereof, and just denote the presence of at least one of such element. The terms "connection" or "link" are not limited to a physical or mechanical connection or link, and may also comprise electrical connection, whatever direct or indirect. The terms "on", "below", "left", "right" and the like are only intended to denote relative positional relationship of objects, and the relative positional relationship may change correspondingly if absolute positions of the described objects change.

Figure 1:
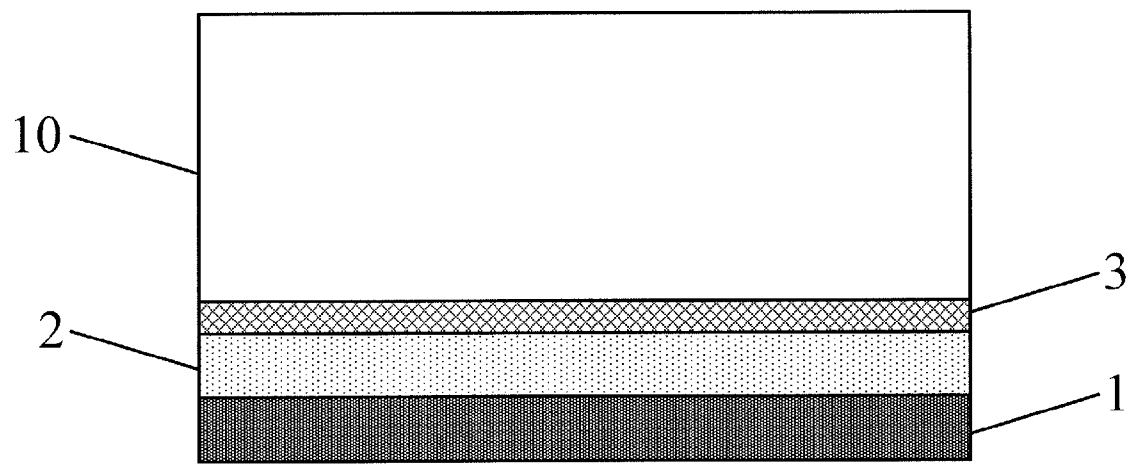
FIG. 1 is a first structural schematic diagram of a self-luminous reflective pixel structure according to an embodiment of the present application.

Embodiments of the present application provide a self-luminous reflective pixel structure, as illustrated in FIG. 1, the pixel structure can comprise: a first electrode 1 capable of reflecting light; a self-luminous layer 2 disposed over the first electrode 1; a second electrode 3 disposed over the self-luminous layer 2; and a reflected light control layer 10 disposed over the second electrode 3.

The self-luminous reflective pixel structure according to the embodiments of the present application can ensure that the whole area of the display region of a pixel serves as luminous or reflective region, which improves the display effect of the display.

In the pixel structure according to the embodiments of the invention, there is provided with both a self-luminous structure and a reflective structure.

The self-luminous structure may be composed of a first electrode 1 of conductive base with high reflection index, a self-luminous layer 2 of transparent material, and a second electrode 3 of transparent material.

In one embodiment, the first electrode 1 can constitute the anode of the self-luminous layer 2, and the second electrode 3 can constitute the cathode of the self-luminous layer 2.

Furthermore, the first electrode 1 can also serve as the cathode of the self-luminous layer and the second electrode 3 can also serve as the anode of the self-luminous layer, depending on the different materials of the self-luminous layer 2 and the manner for luminescence control.

In embodiments of the present application, the self-luminous layer 2 is excited to emit light when the voltage difference between the first electrode 1 and the second electrode 3 is big enough. The self-luminous layer 2 can be an electroluminescence layer.

For example, the self-luminous layer involved in the embodiments of the present application can be an organic light emitting diode (OLED) or an inorganic electroluminescence layer.

Additionally, in embodiments of the present application, besides serving as one electrode of the self-luminous layer 2 and the reflection base of a reflection part, the first electrode 1 can also cooperate with an electrode layer disposed in the reflected light control layer 10 so as to adjust the reflected light. That is to say, the first electrode 1 can also be a portion of the reflective structure according to one embodiment of the present application.

Furthermore, the reflective structure involved in an embodiment of the present application can further comprise a reflected light control layer 10.

Figure 2:
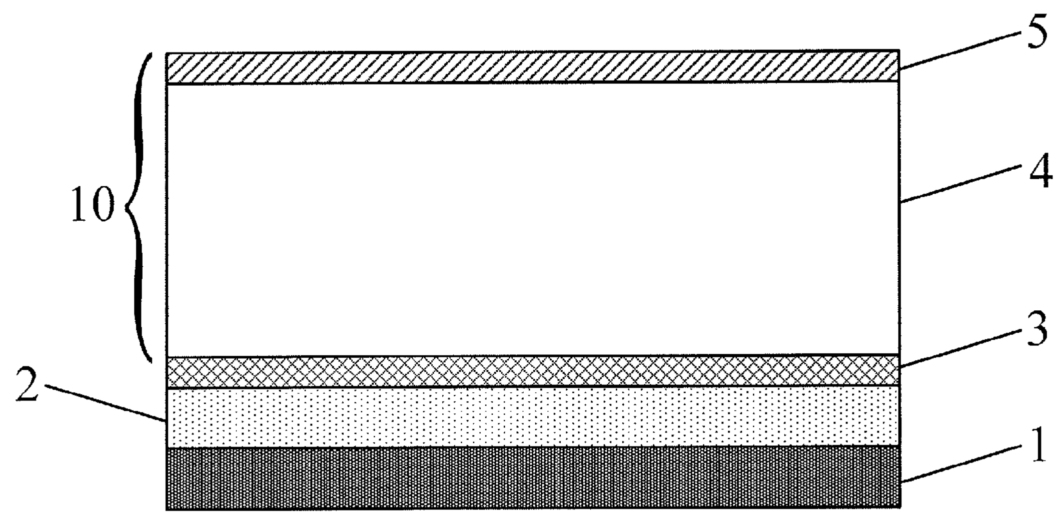
FIG. 2 is a second structural schematic diagram of a self-luminous reflective pixel structure according to an embodiment of the present application.

In one embodiment of the present application, as illustrated in FIG. 2, the reflected light control layer 10 can comprise: a reflected light modulation liquid crystal layer 4 disposed on the second electrode 3 and a liquid crystal control layer 5 disposed over the reflected light modulation liquid crystal layer 4.

In an embodiment of the present application, the liquid crystal in the reflected light modulation liquid crystal 4 will deflect when the voltage difference between the liquid crystal control electrode 5 and the second electrode 3 reaches to a certain value. Thus, modulation of the reflected light is achieved.

It can be found that, in embodiments of the present application, the reflective surface of the reflective structure is the first electrode 1 of the self-luminous structure, while modulation of reflected light is performed by the reflected light modulation liquid crystal layer 4. The liquid crystal in the reflected light modulation liquid crystal 4 can be controlled to deflect, by the voltage difference between the second electrode 3 and the liquid crystal control electrode 5, so as to modulate the reflected light. The second electrode 3 is disposed on one surface of the reflected light modulation liquid crystal 4 and is the upper transparent electrode of the self-luminous structure, and the liquid crystal liquid control electrode 5 is a transparent electrode disposed on the other surface of the reflected light modulation liquid crystal 4.

Figure 3:
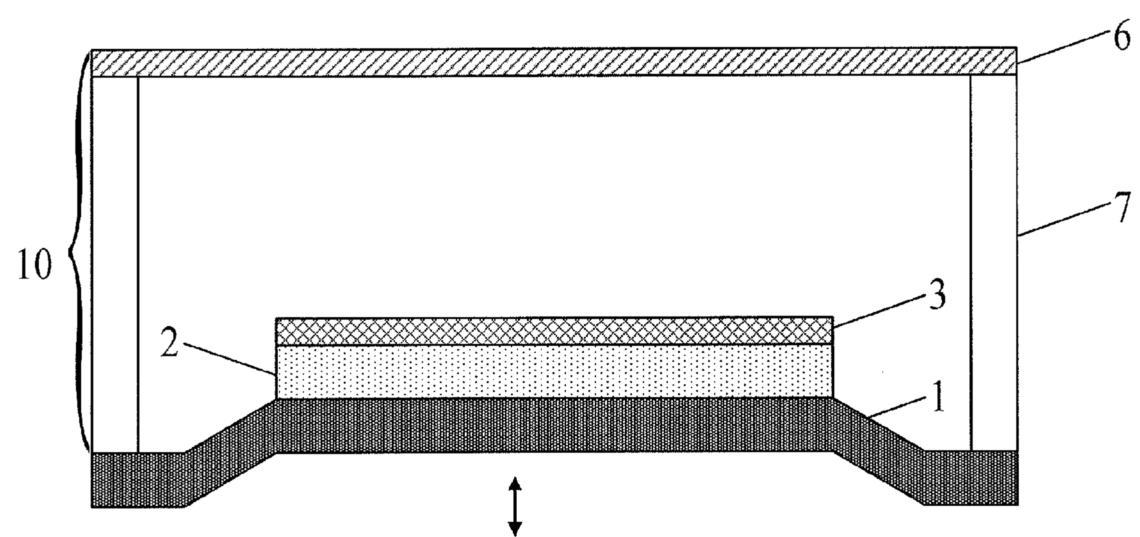
FIG. 3 is a third structural schematic diagram of a self-luminous reflective pixel structure according to an embodiment of the present application.

In one embodiment of the present application, as illustrated in FIG. 3, the reflected light control layer 10 can comprise a reflection clearance control electrode layer 6 disposed over the second electrode 3 and forming a spatial clearance with the second electrode 3. A voltage can applied between the reflection clearance control electrode layer 6 and the first electrode 1, such that an electrostatic force is generated between the reflection clearance control electrode layer 6 and the first electrode 1. The electrostatic force can control the first electrode 1 to move (along the up-down direction as shown by the arrow in FIG. 3) in order to change the size of the spatial clearance between the reflection clearance control electrode layer 6 and the second electrode 3. The reflected light is modulated by changing the size of the clearance so as to control the display.

It can be found that, in one specific embodiment of the present application, the reflective surface of the reflective structure is the movable base electrode of the self-luminous structure, namely the first electrode 1. At the same time, an air clearance is formed between the reflection clearance control electrode layer 6 and the second electrode 3 belonging to the self-luminous structure by means of supports 7. The first electrode 1 that is movable and the self-luminous layer 2 and the second electrode 3 disposed on the first electrode 1 is driven to move up-down by the electrostatic force generated between the reflection clearance control electrode layer 6 and the first electrode 1, such that the size of the spatial clearance is changed. Thus, the reflected light can be intervened and modulation of the reflected light is performed.

As illustrated in FIG. 3, the supports 7 included in the reflected light control layer 10 can be located at both sides of the spatial clearance.

In embodiments of the present application, the self-luminous structure and the reflective structure included in the self-luminous reflective pixel structure are not auxiliary for each other, and only one operating mode works at a moment. The reflective structure operates in the case that ambient light is strong, while the self-luminous structure operates in the case that ambient light is weak.

An external trigger signal is required for the switching between the self-luminous mode and the reflective mode involved in embodiments of the present application. The external trigger signal can be a manual control signal, or a signal from a sensor.

In one specific embodiment of the present application, the switching between the self-luminous mode and the reflective mode is controlled by voltage difference between various electrode layers.

For example, the electric potential of the second layer 3 is set as a constant Vcom; the liquid crystal control electrode 5 is controlled by for example a thin film transistor (TFT) disposed on the upper substrate of the pixel structure and its electric potential is V1; and the first electrode 1 is controlled by for example a TFT disposed on the lower substrate of the pixel structure and its electric potential is V2.

When only the self-luminous structure operates, V1=Vcom, and V2>Vcom.

When only the reflective structure operates, V2=Vcom, and |V1−Vcom|≥0.

Furthermore, in embodiments of the present application, voltages of the respective electrode layers can be controlled separately such that the self-luminous layer will not be excited to emit light in the reflective mode.

In addition to the above described layers, the self-luminous reflective pixel structure according to the present application may further comprise other device layers required by a display pixel unit, such as a polarizing layer, which will not be elaborated herein.

Embodiments of the present application also provide a display panel, which comprises the self-luminous reflective pixel structure according to the embodiments of the present application.

Embodiments of the present application also provide a display device, which comprises the display panel according to the embodiments of the present application.

The display device can be any product or component that has displaying function, such as e-paper, an organic light emitting diode (OLED), a TV set, a digital frame, a cell phone, a tablet PC, and etc.

It can be seen from the above description that, in the self-luminous reflective pixel structure, the display panel and the display device according to the present application, a first electrode capable of reflecting light is disposed, a self-luminous layer is disposed over the first electrode, a second electrode is disposed over the self-luminous layer, and a reflected light control layer is disposed over the second electrode, thus, a self-luminous structure and a reflective structure is formed in a single pixel. The two structures have effective display areas which are substantively equal to each other and equal to the effective area of the whole pixel. Each of the self-luminous mode and the reflective mode can guarantee the area of the display region and has higher display efficiency, thus, the display effect of the display device can be improved. The switching between the self-luminous mode and the reflective mode can be achieved through combination of the levels of the electrodes.

The foregoing are merely exemplary embodiments of the invention, but are not used to limit the protection scope of the invention. The protection scope of the invention shall be defined by the attached claims.

The invention claimed is:

1. A self-luminous reflective pixel structure comprising:

a first electrode capable of reflecting light;

a self-luminous layer disposed over the first electrode;

a second electrode disposed over the self-luminous layer; and a reflected light control layer disposed over the second electrode, wherein the reflected light control layer comprises:

a reflection clearance control electrode layer disposed over the second electrode and forming a spatial clearance with the second electrode;

wherein an electrostatic force generated between the reflection clearance control electrode layer and the first electrode is capable of controlling the first electrode to move so as to change the spatial clearance between the reflection clearance control electrode layer and the second electrode.

2. The self-luminous reflective pixel structure according to claim 1, wherein the first electrode constitutes an anode of the self-luminous layer and the second electrode constitutes a cathode of the self-luminous layer.

3. The self-luminous reflective pixel structure according to claim 2, wherein the self-luminous layer and the second electrode are made of transparent materials.

4. The self-luminous reflective pixel structure according to claim 2, wherein the reflected light control layer comprises:

a reflected light modulation liquid crystal layer disposed over the second electrode;

a liquid crystal control electrode layer disposed over the reflected light modulation liquid crystal layer;

wherein a voltage difference between the liquid crystal control electrode layer and the second electrode is capable of deflecting liquid crystal in the reflected light modulation liquid crystal layer.

5. The self-luminous reflective pixel structure according to claim 1, wherein the first electrode constitutes a cathode of the self-luminous layer and the second electrode constitutes an anode of the self-luminous layer.

6. The self-luminous reflective pixel structure according to claim 5, wherein the self-luminous layer and the second electrode are made of transparent materials.

7. The self-luminous reflective pixel structure according to claim 5, wherein the reflected light control layer comprises:

a reflected light modulation liquid crystal layer disposed over the second electrode;

a liquid crystal control electrode layer disposed over the reflected light modulation liquid crystal layer;

wherein a voltage difference between the liquid crystal control electrode layer and the second electrode is capable of deflecting liquid crystal in the reflected light modulation liquid crystal layer.

8. The self-luminous reflective pixel structure according to claim 1, wherein the reflected light control layer comprises:

a reflected light modulation liquid crystal layer disposed over the second electrode;

a liquid crystal control electrode layer disposed over the reflected light modulation liquid crystal layer;

wherein a voltage difference between the liquid crystal control electrode layer and the second electrode is capable of deflecting liquid crystal in the reflected light modulation liquid crystal layer.

9. The self-luminous reflective pixel structure according to claim 1, wherein the reflected light control layer further comprises supports configured at both sides of the spatial clearance.

10. A display panel comprising the self-luminous reflective pixel structure according to claim 1.

11. A display device comprising the display panel according to claim 10.

12. The self-luminous reflective pixel structure according to claim 1, wherein the self-luminous layer and the second electrode are made of transparent materials.

* * * * *